United States Patent [19]
Kauffman et al.

[11] Patent Number: 5,416,045
[45] Date of Patent: May 16, 1995

[54] METHOD FOR CHEMICAL VAPOR DEPOSITING A TITANIUM NITRIDE LAYER ON A SEMICONDUCTOR WAFER AND METHOD OF ANNEALING TIN FILMS

[75] Inventors: Ralph E. Kauffman, Boise, Id.; Michael J. Prucha, Bigfork, Mont.; James Beck, Boise, Id.; Randhir P. S. Thakur, Boise, Id.; Annette L. Martin, Boise, Id.

[73] Assignee: Micron Technology, Inc., Boise, Id.

[21] Appl. No.: 19,084

[22] Filed: Feb. 18, 1993

[51] Int. Cl.⁶ .......................................... H01L 21/324
[52] U.S. Cl. .................................... 437/174; 437/192; 437/245
[58] Field of Search ............... 437/192, 245, 190, 174; 427/255.2

[56] References Cited

U.S. PATENT DOCUMENTS

| | | | |
|---|---|---|---|
| 4,535,000 | 8/1985 | Gordon | 427/60 |
| 4,570,328 | 2/1986 | Price et al. | 29/571 |
| 4,897,709 | 1/1990 | Yokoyama et al. | 437/197 |
| 5,225,375 | 7/1993 | Aite et al. | 437/225 |

OTHER PUBLICATIONS

Shernman, "Growth and Properties of LPCVD Titanium Nitride . . . ", J. Electrochem. Soc., vol. 137, No. 6, Jun. 1990, pp. 1892–1897.

Wolf et al., Silicon Processing, vol. 1, Lattice Press, 1986, pp. 164–174.

A. Katz et al. "The influence of ammonia on rapid-thermal low-pressure metalorganic chemical vapor deposited $TiN_x$ films from tetrakis (dimethylamido) titanium percursor onto InP", Journal Appl. Phys. 72 (2), Jan. 15, 1992.

A. Katz, "Ohmic Contact to Inp-Based materails Induced by Means of Rapid Thermal Low Pressure (Metallorganic) Chemical Vapor Deposition Technique", Journal of Electronic Materials, vol. 20 No. 12, Dec. 1991.

Primary Examiner—T. N. Quach
Attorney, Agent, or Firm—Wells, St. John, Roberts, Gregory & Matkin

[57] ABSTRACT

A method of chemical vapor depositing a titanium nitride layer on a semiconductor wafer within a chemical vapor deposition reactor includes: a) positioning a wafer within a chemical vapor deposition reactor; b) injecting gaseous $TiCl_4$, $NH_3$ and $N_2$ to within the reactor; and c) maintaining the reactor at a selected pressure and a selected temperature which are effective for reacting the $TiCl_4$ and $NH_3$ to deposit a uniform film comprising titanium nitride on the wafer, the selected temperature being less than or equal to about 500° C. With a TiN film outwardly exposed, a wafer is annealed by the sequential steps of, a) rapid thermal processing the wafer having the outwardly exposed TiN film to a temperature from about 580° C. to about 700° C.; b) exposing the wafer to $NH_3$ gas at a temperature from about 580° C. to about 700° C. for at least about 5 seconds to drive chlorine from the TiN film; c) rapid thermal processing the wafer to a temperature of at least about 780° C.; and d) exposing the wafer to $N_2$ gas at a temperature of at least about 780° C. for at least about 10 seconds.

11 Claims, 1 Drawing Sheet

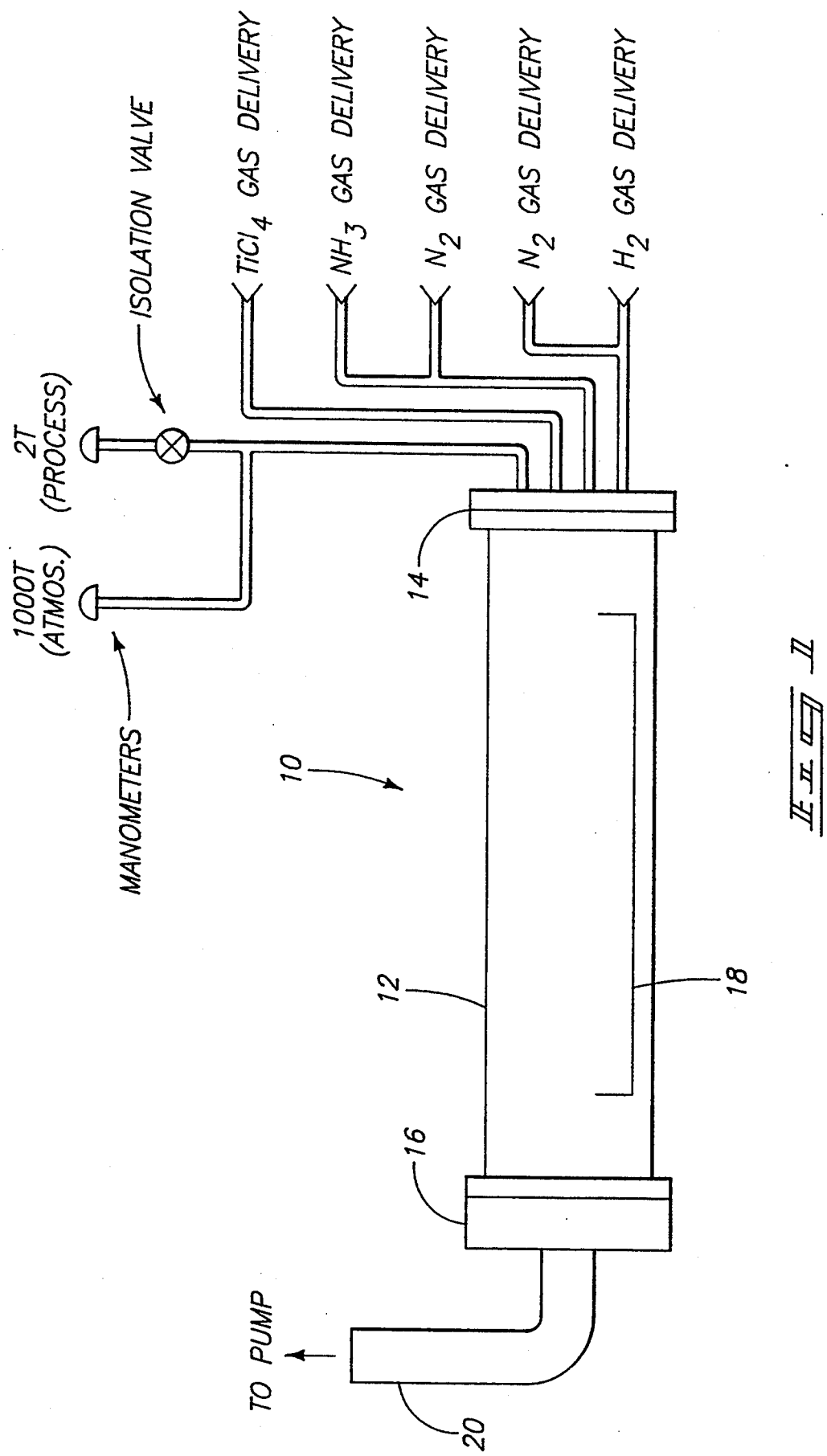

METHOD FOR CHEMICAL VAPOR DEPOSITING A TITANIUM NITRIDE LAYER ON A SEMICONDUCTOR WAFER AND METHOD OF ANNEALING TIN FILMS

TECHNICAL FIELD

This invention relates to titanium nitride (TiN) films.

BACKGROUND OF THE INVENTION

In the processing of integrated circuits, electrical contact must be made to isolated active device regions formed within a wafer/substrate. The active device regions are connected by high electrically conductive paths or lines which are fabricated from an insulator material, which typically covers the substrate surface. To provide for electrical connection between the conductive paths and active-device regions, an opening in the insulator is provided to enable the conductive films to contact the desired regions. Such openings are typically referred to as contact openings, or simply "contacts".

As transistor active area dimensions approached one micron in diameter, conventional process parameters resulted in intolerable increased resistance between the active region or area and the conductive area. The principal way of reducing such contact resistance is by formation of a metal silicide atop the active area prior to application of the conductive film for formation of the conductive runner. One common metal silicide material formed is $TiSi_x$, where x is predominately "2". The $TiSi_x$ material is typically provided by first applying a thin layer of titanium atop the wafer which contacts the active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts the silicon active regions. The applied titanium film everywhere else overlies an insulative, and substantially a non-reactive, $SiO_2$ material.

Ultimately, an electrically conductive contact filling material such as tungsten would be provided for making electrical connection to the contact. However, tungsten adheres poorly to $TiSi_x$. Additionally, it is desirable to prevent intermixing of the contact filling material with the silicide and underlying silicon. Accordingly, an intervening layer is typically provided to prevent the diffusion of the silicon and silicide with the plug filling material, and to effectively adhere the plug filling material to the underlying substrate. Such material is, accordingly, also electrically conductive and commonly referred to as a "barrier layer" due to the anti-diffusion properties.

One material of choice for use as a glue/diffusion barrier layer is titanium nitride. TiN is an attractive material as a contact diffusion barrier in silicon integrated circuits because it behaves as an impermeable barrier to silicon, and because the activation energy for the diffusion of other impurities is very high. TiN is also chemically thermodynamically very stable, and it exhibits a typical low electrical resistivities of a transition metal carbides, borides, or nitrides. TiN might also have other desired uses in semiconductor processing in addition to those referred to above.

TiN can be provided or formed on the substrate in one of the following manners: a) by evaporating Ti in an $N_2$ ambient; b) reactively sputtering Ti in an Ar and $N_2$ mixture; c) sputtering from a TiN target in an inert (Ar) ambient; d) sputtering depositing Ti in an Ar ambient, and converting it to TiN in a separate plasma nitridation step; or e) by low pressure chemical vapor deposition.

As device dimensions continue to shrink, adequate step coverage within the contacts has become problematical with respect to certain deposition techniques. Chemical vapor deposition is known to deposit highly conformal layers, and would be preferable for this reason in depositing into deep, narrow contacts. This invention particularly concerns methods for depositing TiN layers by chemical vapor deposition techniques. One such technique is described in U.S. Pat. No. 4,570,328 to Price et al. However, such discloses a low pressure chemical vapor deposition (LPCVD) process which deposits at temperatures of 680° C. and above. Inadequate titanium nitride films are stated to form at temperatures lower than 680° C. (col.4, lns.61-64). CVD at such high temperatures can lead to undesired reactions resulting in undesired components being introduced into the resultant film.

The U.S. Pat. No. 4,570,328 disclosure also requires utilizing a specially designed and therefor costly LPCVD reactor. Specifically, the reactor utilizes a front flange assembly having injector lines extending therethrough to nozzles within the reactor chamber. Such a construction is costly, thus increasing overall cost for the process. Further, such a reactor requires a premix or diffuser chamber 20 to provide adequate gas mixing for exposure to the wafer. Other prior art reactors utilize injector lines which run the substantial length of the reactor tube at the base of the tube. These injector lines have a plurality of longitudinally spaced, upwardly positioned orifices along the region where the wafers are positioned. Such also adds to reactor cost and process complexity. Accordingly, it would be desirable to develop an LPCVD TiN deposition process from the reaction of $TiCl_4$ and $NH_3$ that does not require such high deposition temperatures or costly and complex furnaces.

LPCVD of TiN films also typically provides undesired bonded chlorine within the resultant film. Such results in an undesired increase in resistance of the film. In an effort to eliminate the chlorine by outgassing, one prior art technique anneals such deposited films. A typical prior art anneal raises the temperature of the wafer by rapid thermal processing (RTP) to 800° C. for 15 to 20 seconds in a nitrogen containing atmosphere. Such results in some reduction in sheet resistance. However, a significant quantity of chlorine remains in the film. Also as a result of the anneal, nitrogen atoms incorporate into the film in an interstitial manner as opposed to being bonded with titanium. Such contributes to the undesired increase in film resistance. Accordingly, it would be desirable to develop better ways of removing undesired chlorine from TiN films and in minimizing sheet resistance of TiN films.

BRIEF DESCRIPTION OF THE DRAWINGS

Preferred embodiments of the invention are described below with reference to the following accompanying drawing, in which FIG. 1 is a diagrammatic view of an LPCVD furnace usable in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with the invention, a method of chemical vapor depositing a titanium nitride layer on a semiconductor wafer within a chemical vapor deposition reactor comprises the following steps:

positioning a wafer within a chemical vapor deposition reactor;

injecting gaseous $TiCl_4$, $NH_3$ and $N_2$ to within the reactor; and maintaining the reactor at a selected pressure and a selected temperature which are effective for reacting the $TiCl_4$ and $NH_3$ to deposit a uniform film comprising titanium nitride on the wafer, the selected temperature being less than or equal to about 500° C.

The simplified chemical equation for deposition of TiN from reaction of $TiCl_4$ and $NH_3$ can be represented as follows:

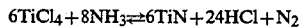

$$6TiCl_4 + 8NH_3 \rightleftharpoons 6TiN + 24HCl + N_2$$

Novelty in accordance with the invention lies in utilization of $N_2$ which functionally enables a deposition temperature of less than or equal to about 500° C., thus preventing the wafer during a TiN deposition from being exposed to potentially hazardous high temperatures. Nitrogen added in with the reactants provides a not fully understood function of increasing TiN deposition on the wafers. Such is theorized to assist principally in the TiN deposition by strengthening or otherwise facilitating the reaction between $TiCl_4$ and $NH_3$, enabling lower reaction temperatures. For example, adding nitrogen within the reactor forces the equilibrium in the above reaction back towards the left or reactant side. As a result, the reaction rate between $TiCl_4$ and $NH_3$ is slowed down, which permits deposition of TiN to occur at much lower and desirable temperatures.

Secondarily, $N_2$ serves as a dilution gas which permits more $TiCl_4$ and $NH_3$ to remain at the wafer surface longer for the desired deposition to occur. In otherwords, the reactant $TiCl_4$ and $NH_3$ are not pumped out of the reactor at as fast a rate as they would be without the $N_2$. $N_2$ also functions as a carrier gas. Alternate carrier gases could of course be utilized, but $N_2$ has been discovered to be required in connection with the above-identified reaction to provide lower deposition temperatures.

Preferably, the deposition temperature in the presence of $N_2$ will fall between about 400° C. and about 500° C., with about 450° C. being typical. Preferred reaction pressures are from about 400 mTorr to about 500 mTorr, with about 450 mTorr being typical.

Preferably the ratio of volumetric flow rates of $N_2$ to $NH_3$ is from about 70:9 respectively to about 100:11 respectively. Also preferably, the ratio of volumetric flow rates of $N_2$ to $TiCl_4$ is from about 35:1 respectively to about 25:1 respectively. Collectively, the ratio of volumetric flow rates of $N_2$ to $TiCl_4$ to $NH_3$ is from about 70:2:9 respectively to about 100:4:11 respectively. Most preferably, the ratio of volumetric flow rates of $N_2$ to $TiCl_4$ to $NH_3$ is about 3:10:80 respectively.

Hydrogen gas ($H_2$) is preferably also injected with the $TiCl_4$, $NH_3$ and $N_2$ during deposition. Such provides additional hydrogen to assure complete transformation of chlorine into HCl, which is gaseous and easily expelled from the reactor. With $H_2$ being injected into the reactor, the preferred ratio of volumetric flow rates of $N_2$ to $NH_3$ to $H_2$ is from about 70:9:15 respectively to about 100:11:40 respectively. Where $H_2$ is injected into the reactor, the preferred ratio of volumetric flow rates of $N_2$ to $TiCl_4$ to $H_2$ are from about 70:2:15 respectively to about 25:1:10 respectively. Collectively, the preferred ratio of volumetric flow rates of $N_2$ to $TiCl_4$ to $NH_3$ to $H_2$ is from about 70:2:9:15 respectively to about 100:4:11:40 respectively. A typical ratio of volumetric flow rates of $N_2$ to $TiCl_4$ to $NH_3$ to $H_2$ would be about 3:10:20:80.

The process also enables use of simpler reactor designs, such as is shown by way of example in FIG. 1. There illustrated is an LPCVD reactor 10 comprised of a reactor tube 12 and front and rear flange assemblies 14 and 16, respectively. Wafers would be positioned within tube 12 within a deposition zone 18, with such zone retaining about 100 wafers in a close, but spaced relation. Front flange assembly 14 includes the variously illustrated gas inlets and manometers. Such gas inlets terminate right at the flange assembly, as opposed to extending to well within the reaction chamber, to inject gases into tube 12 immediately adjacent the inlet flange. Such a construction is less costly than the prior art processes described above. Additionally, use of $N_2$ in accordance with the invention eliminates the need for gas mixers, such as the diffuser mixer of the prior art U.S. Pat. No. 4,570,328 process. An exhaust port 20 connects to a suitable pump for exhausting gases from tube 12.

For processing 100 wafers in the above described furnace, the preferred flow rates are as follows: $TiCl_4$ at from about 10 sccm to 20 sccm; $NH_3$ at from about 45 sccm to about 55 sccm; $H_2$ at about 75 sccm to 200 sccm; and $N_2$ at from about 350 sccm to about 500 sccm. The invention was reduced to practice with the above furnace utilizing $TiCl_4$, $NH_3$, $H_2$, $N_2$ flow rates of 15 sccm, 50 sccm, 100 sccm and 400 sccm, respectively. Temperature and pressure during such deposition were 450° C. and 450 mTorr, respectively. Such resulted in a deposition rate of approximately 15 Angstroms per minute, and provided a highly conformal and densely deposited TiN film.

In accordance with another aspect of the invention, a method of annealing a wafer having an outwardly exposed TiN film containing undesired chlorine atoms to drive chlorine atoms from the film and reduce electrical resistance of the film, comprises the following sequential steps:

a) rapid thermal processing the wafer having the outwardly exposed TiN film to a temperature from about 580° C. to about 700° C.;

b) exposing the wafer to $NH_3$ gas at a temperature from about 580° C. to about 700° C. for at least about 5 seconds;

c) rapid thermal processing the wafer to a temperature of at least about 780° C.; and d) exposing the wafer to $N_2$ gas at a temperature of at least about 780° C. for at least about 10 seconds.

It is preferred to conduct steps "b" and "d" at specified temperatures, such as 650° C. and 800° C., respectively. Further, the rate of temperature increase of steps "a" and "e" is preferably about 60° C. or greater. "Rapid thermal processing" is a term of art, meaning imparting a temperature increase to the wafer of at least about 10° C. per second. Also preferably, the exposure times for steps "b" and "d" are minimized at from about 5 seconds to about 20 seconds and from about 10 seconds to about 30 seconds, respectively. Preferably, the step "b" exposure is conducted in an atmosphere consisting essentially of $NH_3$ to minimize the required step "b" exposure time. Correspondingly, the step "d" exposure time is preferably conducted in an atmosphere consisting essentially of $N_2$ to minimize the required step "d" exposure time. To that end, preferably the $NH_3$ feed is stopped at the conclusion of step "b" and $N_2$ feed started immediately thereafter. Example flow rates for each of $NH_3$ and $N_2$ are from about 1000 sccm to about 6000 sccm, with about 3000 sccm being typical.

Alternate anneal processing in accordance with the invention could of course occur. By way of example only, the wafer could be subjected to a constant 50%—50% feed of $NH_3$-$N_2$, and ramped at a constant rapid thermal temperature increase of 15° C./sec. to 800° C., and held there for an effective amount of time to result in an overall reduction in sheet resistance.

Sheet resistance results in TiN films, in part, from entrained chlorine. For example, some unreacted $TiCl_4$ in a LPCVD process will be entrained in the resultant TiN film, and is nonconductive. Amounts of 4% chlorine have been observed in TiN films. Another source of sheet resistance in TiN films is interstitially entrained nitrogen atoms. For example, prior art high temperature anneals in a nitrogen atmosphere will place nitrogen at interstices within the TiN lattice. Nitrogen occurring in the film in this manner, as opposed to being bonded to Ti, will adversely affect sheet conductance.

The anneal aspect of this invention is understood to function by first reacting entrained $TiCl_4$ with $NH_3$ to form gaseous HCl, which effectively outgases Cl atoms from the film. Such leaves dangling Ti bonds which react with nitrogen atoms introduced into the film in the "d" step exposure. Accordingly, nitrogen from the high temperature anneal principally is incorporated into the film by reaction with Ti, thus forming molecular TiN, as opposed to by interstitial nitrogen atom incorporation.

An anneal process conducted in accordance with the invention with ramp rates of from 60° C./sec. to 72° C./sec., respective 100% $NH_3$ and $N_2$ feeds, respective temperatures of 680° C. and 800° C., and respective exposure times of 15 and 20 seconds resulted in a 64% overall reduction in sheet resistance.

In compliance with the statute, the invention has been described in language more or less specific as to structural and methodical features. It is to be understood, however, that the invention is not limited to the specific features described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of annealing a wafer having an outwardly exposed TiN film containing undesired chlorine atoms to drive chlorine atoms from the film and reduce electrical resistance of the film, the method comprising the following sequential steps:
   a) rapid thermal processing the wafer having the outwardly exposed TiN film to a temperature from 580° C. to 700° C.;
   b) exposing the wafer to $NH_3$ gas at a temperature from 580° C. to 700° C. for at least 5 seconds;
   c) rapid thermal processing the wafer to a temperature of at least 780° C. effective to drive chlorine from the film; and
   d) exposing the wafer to $N_2$ gas at a temperature of at least 780° C. for at least 10 seconds effective to replace chlorine driven from the film with nitrogen.

2. The method of annealing a wafer of claim 1 wherein the step "b" exposure time is from 5 seconds to 20 seconds.

3. The method of annealing a wafer of claim 1 wherein the step "d" exposure time is from 10 seconds to 30 seconds.

4. The method of annealing a wafer of claim 1 wherein the step "b" exposure time is from 5 seconds to 20 seconds, and the step "d" exposure time is from 10 seconds to 30 seconds.

5. The method of annealing a wafer of claim 1 wherein the step "b" exposing is conducted in an atmosphere consisting essentially of $NH_3$.

6. The method of annealing a wafer of claim 1 wherein the step "d" exposing is conducted in an atmosphere consisting essentially of $N_2$.

7. The method of annealing a wafer of claim 1 wherein the step "b" exposing is conducted in an atmosphere consisting essentially of $NH_3$, and the step "d" exposing is conducted in an atmosphere consisting essentially of $N_2$.

8. The method of annealing a wafer of claim 1 wherein the wafer is exposed to $N_2$ starting immediately at the conclusion of step "b".

9. The method of annealing a wafer of claim 1 wherein the step "d" temperature is less than or equal to 850° C.

10. The method of annealing a wafer of claim 1 wherein steps "a" and "c" are conducted at a rate of at least 60° C. per second.

11. A method of annealing a wafer having an outwardly exposed TiN film containing undesired chlorine atoms to drive chlorine atoms from the film and reduce electrical resistance of the film, the method comprising the following sequential steps:
   a) rapid thermal processing the wafer having the outwardly exposed TiN film to a temperature from 580° C. to 700° C.;
   b) exposing the wafer to a gas consisting essentially of $NH_3$ and to a temperature from 580° C. to 700° C. for from 5 seconds to 20 seconds;
   c) immediately at the conclusion of step "b", exposing the wafer to a gas consisting essentially of $N_2$ and rapid thermal processing the wafer to a temperature of from 780° C. to 850° C.; and
   d) exposing the wafer to gas consisting essentially of $N_2$ and to a temperature of from 780° C. to 850° C. for 10 seconds to 30 seconds.

* * * * *